United States Patent
Boldt et al.

(10) Patent No.: US 7,050,762 B2
(45) Date of Patent: May 23, 2006

(54) DIGITALLY CONTROLLED FILTER TUNING FOR WLAN COMMUNICATION DEVICES

(75) Inventors: Juergen Boldt, Dresden (DE); Wolfram Kluge, Dresden (DE); Sascha Beyer, Ottendorf-Okrilla (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 42 days.

(21) Appl. No.: 10/970,266

(22) Filed: Oct. 21, 2004

(65) Prior Publication Data

US 2005/0265401 A1    Dec. 1, 2005

(30) Foreign Application Priority Data

May 28, 2004   (DE) .................... 10 2004 026 148

(51) Int. Cl.
*H04B 1/38* (2006.01)
*H04B 1/40* (2006.01)

(52) U.S. Cl. ....................................................... 455/73

(58) Field of Classification Search ........ 327/552–553; 333/174; 375/219; 455/73, 77, 339, 340
See application file for complete search history.

(56) References Cited

U.S. PATENT DOCUMENTS

| | | | | |
|---|---|---|---|---|
| 5,392,456 A | * | 2/1995 | Mitomo et al. | ........ 340/825.21 |
| 6,208,899 B1 | * | 3/2001 | Kroll | .............................. 607/9 |
| 6,473,466 B1 | * | 10/2002 | Miyashita et al. | .......... 375/267 |

* cited by examiner

*Primary Examiner*—David Mis
(74) *Attorney, Agent, or Firm*—Meyertons Hood Kivlin Kowert & Goetzel, P.C.; B. Noël Kivlin

(57) ABSTRACT

A digitally controlled filter tuning method and corresponding WLAN (Wireless Local Area Network) communication devices and integrated circuit chips are provided. A WLAN communication signal is filtered by a tunable filter. A cut-off frequency of the tunable filter is tuned by a feedback loop. Tuning the cut-off frequency includes comparing by a comparator an output signal emitted by the tunable filter to a reference signal and emitting by the comparator a comparator signal indicative of the difference between the output signal and the reference signal. Further, tuning the cut off frequency comprises receiving the comparator signal by a tuning controller and setting by the tuning controller the cut-off frequency of the tunable filter based on the comparator signal by applying a digital tuning word to the tunable filter. The described filter tuning technique may reduce product and manufacturing costs while providing enhanced tuning accuracy.

42 Claims, 3 Drawing Sheets

DIGITALLY CONTROLLED FILTER TUNING FOR WLAN COMMUNICATION DEVICES

BACKGROUND OF THE INVENTION

1. Field of the Invention

The present invention relates to WLAN (Wireless Local Area Network) communication devices and corresponding methods and integrated circuit chips, and in particular to the filter tuning in such WLAN communication devices.

2. Description of the Related Art

A wireless local area network is a flexible data communication system implemented as an extension to, or as an alternative for, a wired LAN. Using radio frequency or infrared technology, WLAN systems transmit and receive data over the air, minimizing the need for wired connections. Thus, WLAN systems combine data connectivity with user mobility.

Today, most WLAN systems use spread spectrum technology, a wideband radio frequency technique developed for use in reliable and secure communication systems. The spread spectrum technology is designed to trade off bandwidth efficiency for reliability, integrity and security. Two types of spread spectrum radio systems are frequently used: frequency hopping and direct sequence systems.

The standard defining and governing wireless local area networks that operate in the 2.4 GHz spectrum is the IEEE 802.11 standard. To allow higher data rate transmissions, the standard was extended to 802.11b that allows data rates of 5.5 and 11 Mbps in the 2.4 GHz spectrum. Further extensions exist.

Examples of these extensions are the IEEE 802.11a, 802.11b and 802.11g standards. The 802.11a specification applies to wireless ATM (Asynchronous Transfer Mode) systems and is used in access hubs. 802.11a operates at radio frequencies between 5 GHz and 6 GHz. It uses a modulation scheme known as OFDM (Orthogonal Frequency Division Multiplexing) that makes possible data speeds as high as 54 Mbps, but most commonly communications take place at 6 Mbps, 12 Mbps or 24 Mbps. The 802.11b standard uses a modulation method known as CCK (Complementary Code Keying) which allows high data rates and is less susceptible to multipath propagation interference. The 802.11g standard can use data rates of up to 54 Mbps in the 2.4 GHz frequency band using OFDM. Since both 802.11g and 802.11b operate in the 2.4 GHz frequency band, they are completely interoperable. The 802.11g standard defines CCK-OFDM as optional transmit mode that combines the access modes of 802.11and 802.11b, and which can support transmission rates of up to 22 Mbps.

In any transmit mode, a WLAN communication device, i.e. transmitter, receiver or transceiver, needs to filter the communication signal in order to eliminate unwanted interference and noise. In a WLAM receiver, filtering of a received communication signal is accomplished to remove signals with frequencies outside of a determined frequency range to avoid overloading of the receiver, and in particular any signal falling within the image frequency, i.e. the frequency that results, when downconverted by a mixer, to the same intermediate or baseband frequency as the desired communication signal. In a WLAN transmitter, filtering is used to ensure that the transmitter only emits signals within the allowed frequency range by removing other spurious signals that may be introduced into the communication signal, e.g. due to imperfections in the transmitter circuitry.

In order to achieve the desired filtering, there is a need to adjust such filters after manufacturing by initially tuning them to the desired frequency response. This includes tuning the cut-off frequency (or frequencies) of the filter above or below which signals can pass the filter. Since many WLAN communication devices operate at a number of different channels in a given frequency band, continuous tuning of the cut-off frequency during operation of the WLAN communication device is also required. Especially when frequency hopping techniques are used, the tuning circuitry needs to allow for quickly adapting the cut-off frequency to a new channel frequency. Further, continuous tuning is needed for compensating for a cut-off frequency drift caused, e.g., by temperature coefficients of filter components that change in the ambient or operating temperature.

Many conventional WLAN communication systems use a master-slave tuning technique for achieving real time cut-off frequency tuning. In the master-slave architecture, a master oscillator is implemented using circuits similar to those employed within a slave filter to be tuned. Both circuits receive the same frequency control input which is derived by phase locking the master oscillator to an external reference. Thus, when the frequency of the master oscillator is set, the passband frequency of the slave filter is properly tuned. However, substantial additional circuitry is required for implementing the master-slave tuning technique. Therefore, conventional WLAN communication devices often suffer from the problem of increased power consumption. In addition, those WLAN communication devices have the disadvantage of causing high manufacturing and product costs.

In order to overcome the problems arising in master-slave tuning systems, the self-tuning technique was developed. In this approach, the filter is periodically taken offline and tuned directly. Yet, since filtering of the communication signal is interrupted while the filter cut-off frequency is being tuned, prior art WLAN communication devices applying the self-tuning technique often have difficulties in achieving efficient data rates. Further, the filtering accuracy in those devices is decreased due to, e.g., cut-off frequency drift, during the time interval between the individual tuning interruptions.

SUMMARY OF THE INVENTION

An improved filter tuning method and corresponding WLAN communication devices and integrated circuit chips are provided that may overcome the disadvantages of the conventional approaches. In particular, embodiments may allow for lowering the power consumption caused by the tuning circuitry. Other embodiments offer the advantage of reduced product and manufacturing costs. In further embodiments, the achievable communication data rate is increased. In still other embodiments, filter tuning accuracy is enhanced.

In one embodiment, a WLAN communication device is provided comprising a tunable filter for filtering a WLAN communication signal and a feedback loop arranged to tune a cut-off frequency of the tunable filter. The feedback loop comprises a comparator and a tuning controller. The comparator is arranged to compare an output signal emitted by the tunable filter to a reference signal and to emit a comparator signal indicative of the difference between the output signal and the reference signal. The tuning controller is arranged to receive the comparator signal and to set the cut-off frequency of the tunable filter based on the comparator signal by applying a digital tuning word to the tunable filter.

In another embodiment, an integrated circuit chip for performing WLAN communication is provided comprising a tunable filter circuit for filtering a WLAN communication signal and a feedback loop circuit arranged to tune a cut-off frequency of the tunable filter circuit. The feedback loop circuit comprises a comparator circuit and a tuning control circuit. The comparator circuit is arranged to compare an output signal emitted by the tunable filter circuit to a reference signal and to emit a comparator signal indicative of the difference between the output signal and the reference signal. The tuning control circuit is arranged to receive the comparator signal and to set the cut-off frequency of the tunable filter circuit based on the comparator signal by applying a digital tuning word to the tunable filter circuit.

In a further embodiment, a method of operating a WLAN communication device is provided. A WLAN communication signal is filtered by a tunable filter. A cut-off frequency of the tunable filter is tuned by a feedback loop. Tuning the cut-off frequency of the tunable filter comprises comparing by a comparator an output signal emitted by the tunable filter to a reference signal and emitting by the comparator a comparator signal indicative of the difference between the output signal and the reference signal. Further, tuning the cut-off frequency of the tunable filter comprises receiving the comparator signal by a tuning controller and setting by the tuning controller the cut off frequency of the tunable filter filter.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention, as illustrated in the accompanying drawings, wherein.

DETAILED DESCRIPTION OF THE INVENTION

Figure 1:
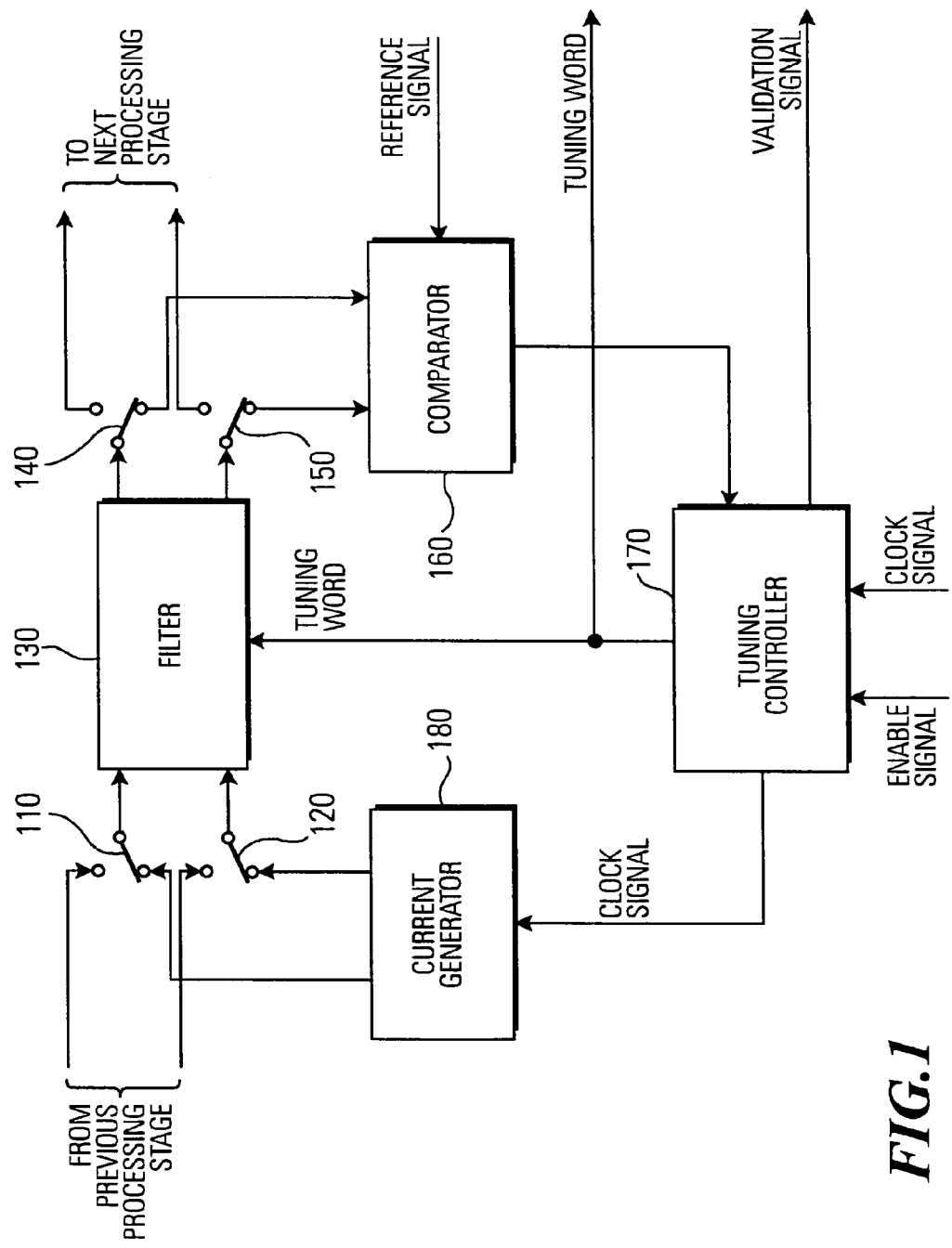
FIG. 1 is a block diagram illustrating components of a filter tuning implementation in a WLAN communication device according to an embodiment.

The illustrative embodiments of the present invention will be described with reference to the figure drawings Referring now to the drawings and in particular to FIG. 1, components of a filter tuning implementation in a WLAN communication device according to an embodiment are shown. While the WLAN communication device is in a processing mode, a communication signal is passed from a previous processing stage acting on the communication signal within the WLAN communication device through a filter 130. The resulting filtered communication signal is forwarded from the filter 130 to a next processing stage within the WLAN communication device for further processing of the filtered communication signal. The previous processing stage and the next processing stage may comprise, e.g., mixers, amplifiers, A/D converters, etc.

According to the present embodiment, the WLAN communication device comprises switches 110, 120, 140, 150 for connecting the filter 130 either to the previous/next processing stage or to a feedback loop for tuning the filter cut-off frequency. When the WLAN communication device transitions from the processing mode to a filter tuning mode, the switches 110, 120, 140, 150 may disconnect the filter 130 from the previous/next processing stage and connect the filter 130 to the tuning feedback loop and vice versa. In the present embodiment, the switches 110, 120, 140, 150 are analog switches. The switches 110, 120, 140, may be operated independently from each other or simultaneously. For example, the filter pair 110, 120, the filter pair 140, 150, or all four switches 110, 120, 140, 150 may be operated simultaneously.

For tuning the cut-off frequency of the filter 130, the filter 130 may be connected to the tuning feedback loop. In the present embodiment, the tuning feedback loop comprises a comparator 160, a tuning controller 170 and a current generator 180. The current generator 180 may provide a test signal to the filter 130 over the switches 110, 120. According to the embodiment, the current generator 180 produces current pulses having a defined current level that are used as the test signal. The current pulses may be generated periodically, e.g., at 20 MHz based on a clock signal provided to the current generator 180. The tuning feedback loop may further comprise a comparator 160 which may receive over the switches 140, 150 an output signal of the filter 130 which may correspond to the filtered test signal while the WLAN communication device is in the filter tuning mode. The output signal of the filter 130 may undergo further processing, e.g., amplification or frequency conversion, before being input to the comparator 160. According to the present embodiment, the comparator 160 is a high speed comparator.

The comparator 160 may further receive a reference signal and compare the output signal of the filter 130 to the reference signal. This may include measuring the level of the output signal, which may be an AC signal, and comparing the measured level to the level of the reference signal. For this purpose, the comparator 160 may include level detecting and comparing subunits. The reference signal may be, e.g., a DC voltage signal or a DC current signal derived from a bandgap-source, which may set defined switching thresholds within the comparator 16O. The comparator 160 may emit a comparator signal indicative of the result of comparing the output signal and the reference signal, i.e. of the difference between those two signals. For instance, the comparator signal may be a current or voltage signal.

The comparator signal may be provided to the tuning controller 170. In the present embodiment, the tuning controller 170 is a digital block. Based on the comparator signal, the tuning controller 170 may generate a digital tuning word and provide the digital tuning word the filter 130. Further, the digital tuning word may be supplied to further filters or circuits within the WLAN communication device in parallel. In the described embodiment, the digital tuning word is a five bit digital tuning word. Other digital tuning words may also be used. The tuning controller 170 may comprise a counter for increasing and/or decreasing the digital tuning word based on a clock signal provided to the tuning controller 170.

The clock signal may be generated by a clock oscillator within the WLAN communication device. According to the present embodiment, the clock signal is generated at a frequency of 20 MHz. Alternatively, other frequencies may be used for the clock signal. The tuning controller 170 may forward the clock signal to the current generator 180. In other embodiments, the clock signal may be provided to the tuning controller 170 and the current generator 180 in parallel. In still other embodiments, different clock signals may be provided to the tuning controller 170 and the current generator 180. This may be accomplished, e.g., by using different clock oscillators or by passing the clock signal through frequency multipliers or dividers before providing it to the tuning controller 170 and/or the current generator 180.

The tuning controller 170 may further be provided with an enable signal initiating the tuning controller 170 to start the counter. Upon reception of the enable signal or upon having started the counter, the tuning controller 170 may in turn output an enable confirmation signal. Further, the tuning controller 170 may receive a disable signal causing the tuning controller 170 to stop the counter. Alternatively, the tuning controller 170 may stop the counter individually, for example once the comparator signal indicates that the output signal of the filter 130 equals the reference signal. Upon having received the disable signal or having stopped the counter, the tuning controller 170 may emit a disable confirmation signal.

Once the filter 130 is properly tuned, i.e. the comparator signal indicates that the output signal of the filter 130 corresponds to the reference signal, the tuning controller 170 may output a validation signal indicating that the actual digital tuning word is valid. In other embodiments, the digital tuning word may be provided to the further filters or circuits only when the tuning controller 170 has output the validation signal. For this purpose, switches may be interposed between the tuning controller 170 and the further filters or circuits within the WLAN communication device.

In addition to the components shown in FIG. 1, the WLAN communication device may comprise one or more further controllers for setting the switches 110, 120, 140, 150, providing the reference signal to the comparator 160, exchanging the enable signal and/or the enable confirmation signal with the tuning controller 170, receiving the validation signal from the tuning controller 170, and/or exchanging the disable signal and/or the disable confirmation signal with the tuning controller 170. In further embodiments, the switches 110, 120, 140, 150 may be controlled, e.g., by the tuning controller 170.

Figure 2:
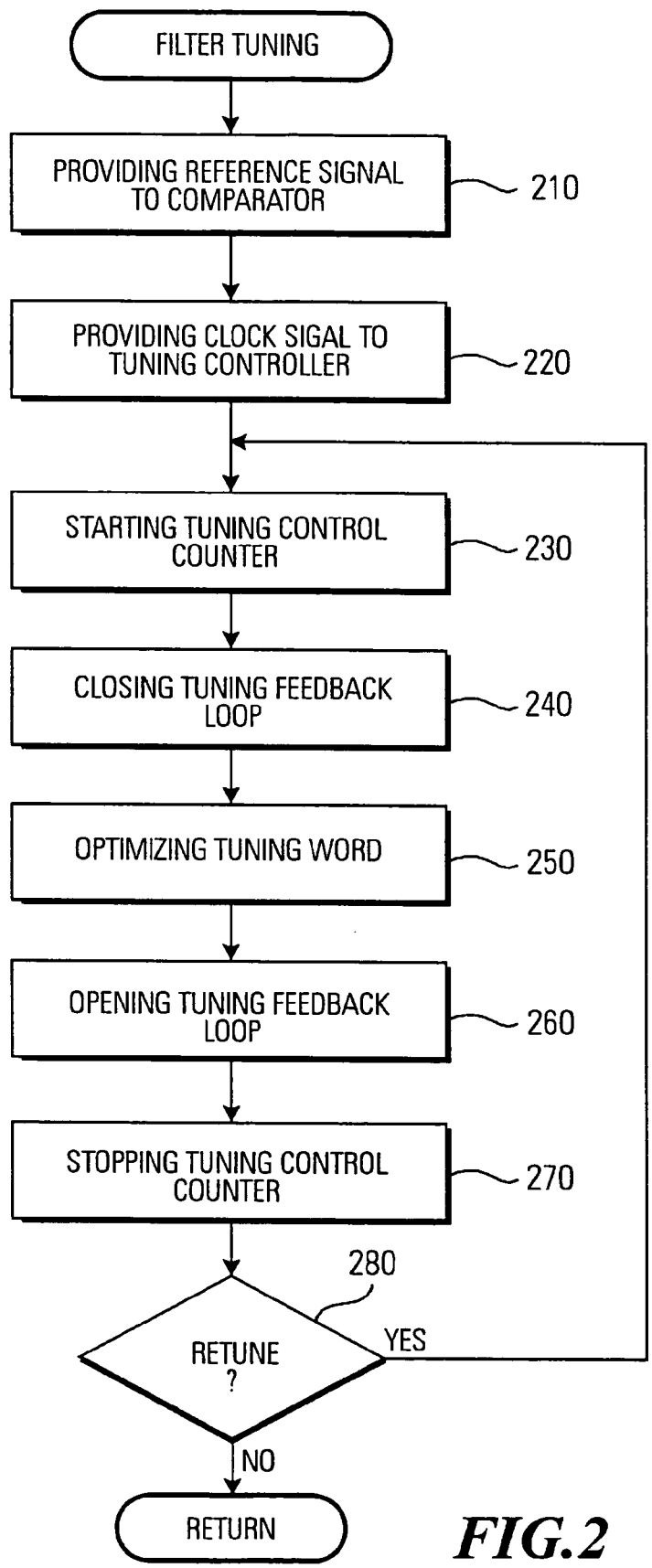
FIG. 2 is a flow diagram illustrating a filter tuning process according to an embodiment.

Turning now to FIG. 2, a flow diagram of the filter tuning process according to an embodiment is shown. In step 210, the reference signal may be provided to the comparator 160. According to the present embodiment, a voltage signal is used for the reference signal. The clock signal may be provided to the tuning controller 170 in step 220.

In step 230, the counter within the tuning controller 170 may be started. This step may be preceded by receiving the enable signal by the tuning controller 170. Further, the tuning controller 170 may emit an enable confirmation signal upon having received the enable signal or upon having started the counter in step 230.

In step 240, the tuning feedback loop may be closed. This may be achieved by setting the switches 110, 120, 140, 150 to disconnect the filter 130 from the previous processing stage and the next processing stage and to connect the filter 130 to the feedback loop comprising the comparator 160, the tuning controller 170 and the current generator 180. Once the tuning feedback loop has been closed in step 240, the digital tuning word provided by the tuning controller 170 to the filter 130 may be optimized in step 250. This step will be described in more detail with reference to FIG. 3.

Upon having optimized the digital tuning word in step 250, the tuning feedback loop may be opened in step 260.

This may comprise setting the switches 110, 120, 140, 150 to reconnect the filter 130 with the previous processing stage and the next processing stage of the communication signal. In step 270, the counter within the tuning controller 170 may be stopped. As indicated above, this may be achieved by the tuning controller 170 individually or upon a disable signal provided to the tuning controller 170. Upon having received the disable signal or upon having stopped the counter in step 270, the tuning controller 170 may output a disable confirmation signal.

In step 280, it may be determined whether the cut-off frequency of the filter 130 is to be retuned. Retuning may be performed, e.g., periodically at a certain repetition rate or when particular process variables have changed, for example when the WLAN communication device has switched to another communication channel. Retuning may be initiated, for instance, by the tuning controller 170, an additional separate controller, or a detector identifying a change in the reference signal.

If the determination in step 280 yields that the cut-off frequency of the filter 130 is to be retuned, the filter tuning scheme may return to step 230 for restarting the counter in the tuning controller 170. Otherwise, the filter tuning process may be complete at this point.

The sequence of steps shown in FIG. 2 has been chosen for illustration purposes only and is not to be understood as limiting the invention. For instance, steps 210 to 240 may be performed in a different order. Accordingly, steps 260 and 270 may be performed in the inverse order. Further, the reference signal provided to the comparator 160 in step 210 may be disabled once the digital tuning word has been optimized in step 250 and reenabled if the necessity for retuning the cut-off frequency of the filter 130 has been determined in step 280.

Figure 3:
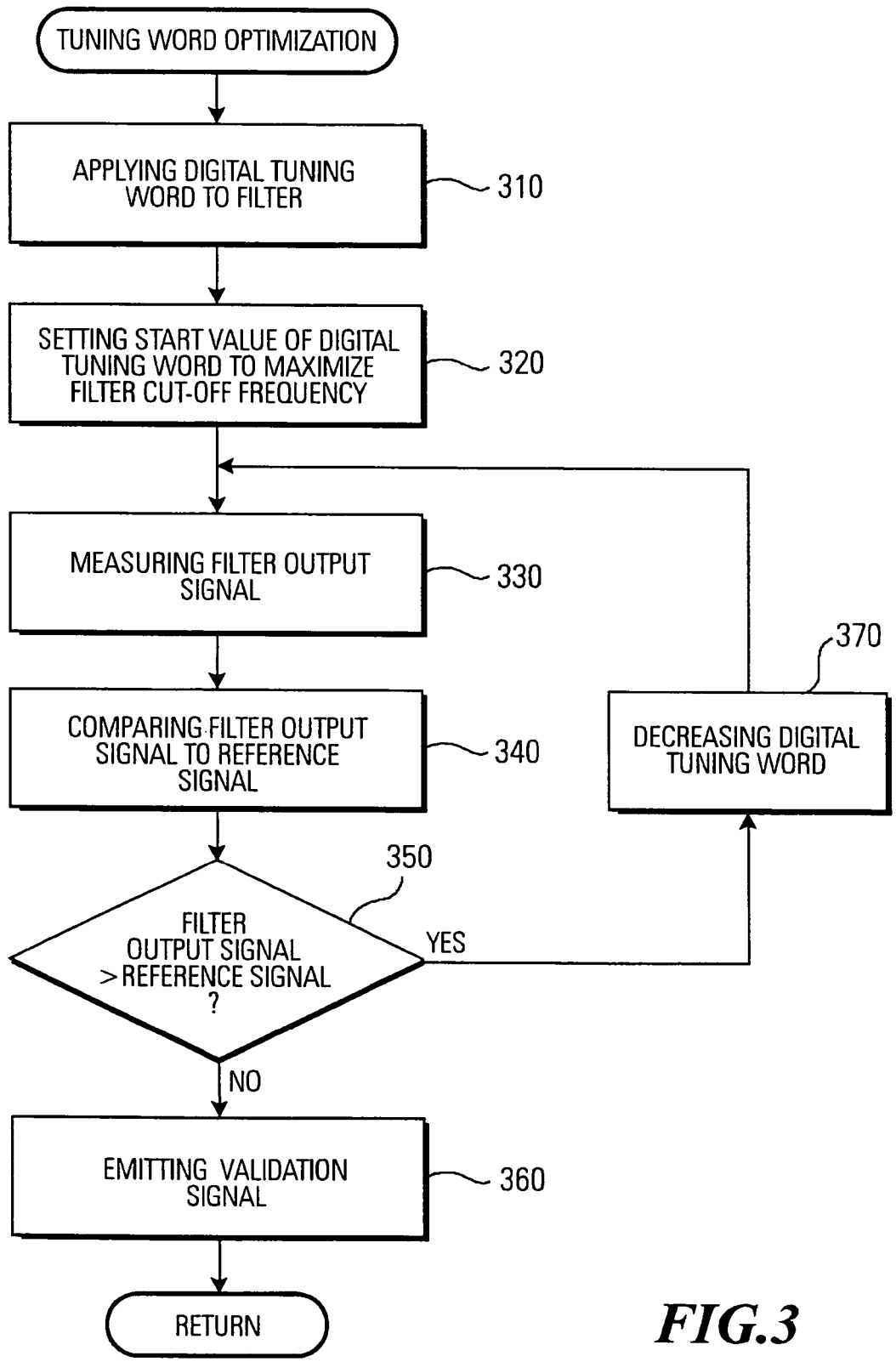
FIG. 3 is a flow diagram illustrating the tuning word optimization in the filter tuning process of FIG. 2 according to an embodiment.

FIG. 3 shows step 250 of optimizing the digital tuning word in more detail. In step 310, the digital tuning word may be provided by a tuning controller 170 to the filter 130. The start value of the digital tuning word may be set in step 320 so as to maximize the cut-off frequency of the filter 130. In step 330, the filter output signal may be measured by the comparator 160. This may include measuring the level of the output signal. Further, the level of the reference signal provided to the comparator 160 may be measured. The comparator 160 may compare the output signal of the filter 130 to the reference signal in step 340. According to the present embodiment, step 340 comprises comparing the levels of the output signal and the reference signal.

In step 350, it may be determined whether the level of the output signal is higher than the level of the reference signal. According to the present embodiment, step 350 is performed by the comparator 160. If the level of the output signal is higher than the level of the reference signal, the tuning controller 170 may decrease the digital tuning word in step 370. In the present embodiment, decreasing the digital tuning word causes the cut-off frequency of the filter 130 to decrease as well. The sequence of steps 370, 330, 340 and 350 may be repeated until the level of the output signal equals the level of the reference signal. Once this is the case, the tuning controller 170 may output the validation signal indicating that the corresponding digital tuning word is valid.

In other embodiments, the start value of the digital tuning word may be set in step 320 to minimize the cut-off frequency of the filter 130. In such embodiments it may be determined in step 350 whether the level of the output signal is lower than the level of the reference signal, and if this is the case, the tuning controller may increase the digital tuning word in step 370.

The filter 130 may be a low pass or high pass filter removing signals having frequencies that are above or below the cut-off frequency, respectively. Alternatively, the filter 130 may also be a bandpass filter or a bandstop filter blocking signals outside or inside a certain frequency band, respectively. For bandpass and bandstop filters, the presented filter tuning method may be applied for tuning a center frequency and or the corner frequencies of the filter frequency band.

As apparent from the above description of embodiments, an improved method and apparatus for adjusting the frequency response of the filter 130 depending on the process variations has been presented. The discussed filter tuning may simplify the manufacturing of corresponding WLAN communication devices as well as improve their accuracy and increase their operating range.

The input of the filter 130 may be connected with a current generator 180 using an analog switch 110, 120. The current generator 180 may provide current pulses with a frequency of, e.g., 20 MHz with a defined current level.

The digital block 170 may generate a digital tuning word of, for example, five bits, which may adjust the filter 130 to the highest cut-off frequency. The output signal of the filter 130 may be measured by the high speed comparator 160. The comparator 160 may compare the output level to the reference level.

When the output level is higher than reference level, the digital word may be decreased. The comparator may measure the level again. This procedure may be repeated until the reference level is detected. The counter in the digital block may be stopped and the five bit output word may be valid.

As discussed above, a high speed comparator 160 may be used for comparing the output signal of the filter 130 to the reference signal, allowing for the time during which the filter 130 is disconnected from the communication signal path for tuning purposes to be significantly reduced. Further, the tuning process may be accelerated by digitally controlling the filter tuning. This may be accomplished by providing e digital tuning word to the filter 130, which may be generated by a digital block. Moreover, the digitized filter tuning control may increase the filter tuning accuracy.

While the invention has been described with respect to the physical embodiments constructed in accordance therewith, it will be apparent to those skilled in the art that various modifications, variations and improvements of the present invention may be made in the light of the above teachings and within the purview of the appended claims with out departing from the scope of the invention. In addition, those areas in which it is believed that those of ordinary skill in the art are familiar, have not been described herein in order to not unnecessarily obscure the invention described herein. Accordingly, it is to be understood that the invention is not to be limited by the specific illustrative embodiments, but only by the scope of the appended claims.

What is claimed is:

1. A WLAN (Wireless Local Area Network) communication device comprising:
   a tunable filter for filtering a WLAN communication signal; and
   a feedback loop arranged to tune a cut-off frequency of the tunable filter, comprising:
   a comparator arranged to compare an output signal emitted by the tunable filter to a reference signal and to emit a comparator signal indicative of the difference between the output signal and the reference signal; and
   a tuning controller arranged to receive the comparator signal and to set the cut-off frequency of the tunable filter based on the comparator signal by applying a digital tuning word to the tunable filter.

2. The WLAN communication device of claim 1, further comprising a clock oscillator arranged to provide a clock signal to the tuning controller.

3. The WLAN communication device of claim 1, wherein the tuning controller comprises a counter arranged to increase and/or decrease the digital tuning word.

4. The WLAN communication device of claim 3, wherein the tuning controller is further arranged to start and/or stop the counter.

5. The WLAN communication device of claim 4, wherein the tuning controller is further arranged to receive an enable signal and to start the counter upon reception of the enable signal.

6. The WLAN communication device of claim 3, further comprising a clock oscillator arranged to provide a clock signal to the tuning controller; and
   wherein the tuning controller is further arranged to apply the clock signal to the counter.

7. The WLAN communication device of claim 1, further comprising a current generator arranged to provide a test signal to the tunable filter; and
   wherein the output signal emitted by the tunable filter is based on the test signal.

8. The WLAN communication device of claim 7, further comprising a clock oscillator arranged to provide a clock signal to the tuning controller; and
   wherein the tuning controller is further arranged to forward the clock signal to the current generator.

9. The WLAN communication device of claim 8, wherein the current generator is further arranged to provide the test signal by generating current pulses based on the clock signal.

10. The WLAN communication device of claim 1, further comprising:
    a first processing unit preceding the tunable filter in the processing path of the WLAN communication signal and arranged to provide the WLAN communication signal to the tunable filter; and
    a first switch arranged to connect the tunable filter either to the first processing unit or to the feedback loop.

11. The WLAN communication device of claim 1, further comprising:
    a second processing unit following the tunable filter in the processing path of the WLAN communication signal and arranged to receive the filtered WLAN communication signal from the tunable filter; and
    a second switch arranged to connect the tunable filter either to the second processing unit or to the feedback loop.

12. The WLAN communication device of claim 1, wherein the tuning controller is further arranged to set the cut-off frequency of the tunable filter by applying a 5 bit digital tuning word to the tunable filter.

13. The WLAN communication device of claim 1, further comprising at least one further tunable filter; and
    wherein the tuning controller is further arranged to set the cut-off frequency of the tunable filter and of the at least one further tunable filter by applying the digital tuning word to the tunable filter and the at least one further tunable filter in parallel.

14. The WLAN communication device of claim 1, wherein the tuning controller is further arranged to emit a validation signal for validating the digital tuning word when the comparator signal indicates identity between the output signal and the reference signal.

15. An integrated circuit chip for performing WLAN (Wireless Local Area Network) communication, comprising:
a tunable filter circuit for filtering a WLAN communication signal; and
a feedback loop circuit arranged to tune a cut-off frequency of the tunable filter circuit, comprising:
a comparator circuit arranged to compare an output signal emitted by the tunable filter circuit to a reference signal and to emit a comparator signal indicative of the difference between the output signal and the reference signal; and
a tuning control circuit arranged to receive the comparator signal and to set the cut-off frequency of the tunable filter circuit based on the comparator signal by applying a digital tuning word to the tunable filter circuit.

16. The integrated circuit chip of claim 15, further comprising a clock oscillator circuit arranged to provide a clock signal to the tuning control circuit.

17. The integrated circuit chip of claim 15, wherein the tuning control circuit comprises a counting circuit arranged to increase and/or decrease the digital tuning word.

18. The integrated circuit chip of claim 17, wherein the tuning control circuit is further arranged to start and/or stop the counting circuit.

19. The integrated circuit chip of claim 18, wherein the tuning control circuit is further arranged to receive an enable signal and to start the counting circuit upon reception of the enable signal.

20. The integrated circuit chip of claim 17, further comprising a clock oscillator circuit arranged to provide a clock signal to the tuning control circuit; and
wherein the tuning control circuit is further arranged to apply the clock signal to the counting circuit.

21. The integrated circuit chip of claim 15, further comprising a current generator circuit arranged to provide a test signal to the tunable filter circuit; and
wherein the output signal emitted by the tunable filter circuit is based on the test signal.

22. The integrated circuit chip of claim 21, further comprising a clock oscillator circuit arranged to provide a clock signal to the tuning control circuit; and
wherein the tuning control circuit is further arranged to forward the clock signal to the current generator circuit.

23. The integrated circuit chip of claim 22, wherein the current generator circuit is further arranged to provide the test signal by generating current pulses based on the clock signal.

24. The integrated circuit chip of claim 15, further comprising:
a first processing circuit preceding the tunable filter circuit in the processing path of the WLAN communication signal and arranged to provide the WLAN communication signal to the tunable filter circuit; and
a first switch arranged to connect the tunable filter circuit either to the first processing circuit or to the feedback loop circuit.

25. The integrated circuit chip of claim 15, further comprising:
a second processing circuit following the tunable filter circuit in the processing path of the WLAN communication signal and arranged to receive the filtered WLAN communication signal from the tunable filter circuit; and
a second switch arranged to connect the tunable filter circuit either to the second processing circuit or to the feedback loop circuit.

26. The integrated circuit chip of claim 15, wherein the tuning control circuit is further arranged to set the cut-off frequency of the tunable filter circuit by applying a 5 bit digital tuning word to the tunable filter circuit.

27. The integrated circuit chip of claim 15, further comprising at least one further tunable filter circuit; and
wherein the tuning control circuit is further arranged to set the cut-off frequency of the tunable filter circuit and of the at least one further tunable filter circuit by applying the digital tuning word to the tunable filter circuit and the at least one further tunable filter circuit in parallel.

28. The integrated circuit chip of claim 15, wherein the tuning control circuit is further arranged to emit a validation signal for validating the digital tuning word when the comparator signal indicates identity between the output signal and the reference signal.

29. A method of operating a WLAN (Wireless Local Area Network) communication device, comprising:
filtering a WLAN communication signal by a tunable filter; and
tuning a cut-off frequency of the tunable filter by a feedback loop;
wherein tuning the cut-off frequency of the tunable filter comprises:
comparing, by a comparator, an output signal emitted by the tunable filter to a reference signal;
emitting, by the comparator, a comparator signal indicative of the difference between the output signal and the reference signal;
receiving the comparator signal by a tuning controller; and
setting, by the tuning controller, the cut-off frequency of the tunable filter based on the comparator signal by applying a digital tuning word to the tunable filter.

30. The method of claim 29, wherein tuning the cut-off frequency of the tunable filter further comprises providing a clock signal to the tuning controller by a clock oscillator.

31. The method of claim 29, wherein tuning the cut-off frequency of the tunable filter further comprises increasing and/or decreasing the digital tuning word by a counter within the tuning controller.

32. The method of claim 31, wherein tuning the cut-off frequency of the tunable filter further comprises starting and/or stopping the counter by the tuning controller.

33. The method of claim 32, wherein tuning the cut-off frequency of the tunable filter further comprises:
receiving an enable signal by the tuning controller; and
starting, by the tuning controller, the counter upon reception of the enable signal.

34. The method of claim 31, wherein tuning the cut-off frequency of the tunable filter further comprises:
providing a clock signal to the tuning controller by a clock oscillator; and
applying the clock signal to the counter by the tuning controller.

35. The method of claim 29, wherein tuning the cut-off frequency of the tunable filter further comprises:
providing a test signal to the tunable filter by a current generator; and
emitting, by the tunable filter, the output signal based on the test signal.

36. The method of claim 35, wherein tuning the cut-off frequency of the tunable filter further comprises:

providing a clock signal to the tuning controller by a clock oscillator; and forwarding, by the tuning controller, the clock signal to the current generator.

37. The method of claim 36, wherein providing the test signal by the current generator comprises generating current pulses based on the clock signal.

38. The method of claim 29, further comprising processing the WLAN communication signal by a first processing unit preceding the tunable filter in the processing path of the WLAN communication signal and arranged to provide the WLAN communication signal to the tunable filter; and wherein tuning the cut-off frequency of the tunable filter further comprises operating a first switch to disconnect the tunable filter from the first processing unit and connect the tunable filter to the feedback loop.

39. The method of claim 29, further comprising processing the WLAN communication signal by a second processing unit following the tunable filter in the processing path of the WLAN communication signal and arranged to receive the filtered WLAN communication signal from the tunable filter; and wherein tuning the cut-off frequency of the tunable filter further comprises operating a second switch to disconnect the tunable filter from the second processing unit and connect the tunable filter to the feedback loop.

40. The method of claim 29, wherein setting the cut-off frequency of the tunable filter by the tuning controller comprises applying a 5 bit digital tuning word to the tunable filter.

41. The method of claim 29, further comprising:

filtering the WLAN communication signal by at least one further tunable filter; and applying, by the tuning controller, the digital tuning word to the tunable filter and the at least one further tunable filter in parallel.

42. The method of claim 29, wherein tuning the cut-off frequency of the tunable filter further comprises emitting, by the tuning controller, a validation signal for validating the digital tuning word when the comparator signal indicates identity between the output signal and the reference signal.

* * * * *